(12) United States Patent
Smythe et al.

(10) Patent No.: US 8,193,439 B2
(45) Date of Patent: Jun. 5, 2012

(54) THERMOELECTRIC MODULES AND RELATED METHODS

(75) Inventors: Robert Michael Smythe, Ewing, NJ (US); Jeffrey Gerard Hershberger, Shaker Heights, OH (US)

(73) Assignee: Laird Technologies, Inc., Earth City, MO (US)

( * ) Notice: Subject to any disclaimer, the term of this patent is extended or adjusted under 35 U.S.C. 154(b) by 575 days.

(21) Appl. No.: 12/490,204

(22) Filed: Jun. 23, 2009

(65) Prior Publication Data

US 2010/0319744 A1 Dec. 23, 2010

(51) Int. Cl.
*H01L 37/00* (2006.01)
*H01L 35/34* (2006.01)

(52) U.S. Cl. ...................................................... 136/201

(58) Field of Classification Search .................. 136/200, 136/201, 203, 205, 211, 212, 236.1, 238, 136/240
See application file for complete search history.

(56) References Cited

U.S. PATENT DOCUMENTS

| | | | |
|---|---|---|---|
| 3,771,091 A | 11/1973 | Harnden, Jr. | |
| 4,859,250 A | 8/1989 | Buist | |
| 5,038,569 A * | 8/1991 | Shirota et al. ................... 62/3.2 |
| 5,040,381 A | 8/1991 | Hazen | |
| 5,576,512 A | 11/1996 | Doke | |
| 5,653,741 A | 8/1997 | Grant | |
| 5,856,210 A | 1/1999 | Leavitt et al. | |
| 5,950,067 A | 9/1999 | Maegawa et al. | |
| 5,966,941 A | 10/1999 | Ghoshal | |
| 6,025,554 A | 2/2000 | Macris | |
| 6,232,542 B1 | 5/2001 | Hiraishi et al. | |
| 6,274,803 B1 | 8/2001 | Yoshioka et al. | |
| 6,385,976 B1 | 5/2002 | Yamamura et al. | |
| 6,410,971 B1 | 6/2002 | Otey | |
| 6,523,354 B1 | 2/2003 | Tolbert | |
| 6,710,312 B2 | 3/2004 | Bicker et al. | |
| 2002/0034843 A1 | 3/2002 | Udrea et al. | |
| 2002/0048296 A1 | 4/2002 | Kuriyama et al. | |
| 2003/0089391 A1 | 5/2003 | Fukudome et al. | |
| 2004/0251539 A1 | 12/2004 | Faris et al. | |
| 2004/0261830 A1 | 12/2004 | Sharp et al. | |
| 2005/0121065 A1 | 6/2005 | Otey | |
| 2005/0126184 A1 | 6/2005 | Cauchy | |
| 2005/0139249 A1 * | 6/2005 | Ueki et al. ..................... 136/211 |
| 2005/0208301 A1 | 9/2005 | Okamoto et al. | |

(Continued)

FOREIGN PATENT DOCUMENTS

DE 19525200 1/1997

(Continued)

*Primary Examiner* — Jennifer Michener
*Assistant Examiner* — Eli Mekhlin
(74) *Attorney, Agent, or Firm* — Harness, Dickey & Pierce, P.L.C.

(57) ABSTRACT

An example method for making thermoelectric modules generally includes coupling a first wafer and a second wafer together, processing the first and second wafers to produce a first thermoelectric element and a second thermoelectric element where the first thermoelectric element and the second thermoelectric element are coupled together, coupling the first thermoelectric element to a first conductor, coupling the second thermoelectric element to a second conductor, separating the first thermoelectric element and the second thermoelectric element, coupling the first thermoelectric element to a third conductor whereby the first thermoelectric element, the first conductor, and the third conductor form at least part of a thermoelectric module, and coupling the second thermoelectric element to a fourth conductor whereby the second thermoelectric element, the second conductor, and the fourth conductor form at least part of another thermoelectric module.

27 Claims, 3 Drawing Sheets

U.S. PATENT DOCUMENTS

| | | |
|---|---|---|
| 2006/0124165 A1 | 6/2006 | Bierschenk et al. |
| 2006/0266404 A1 | 11/2006 | Hiller et al. |
| 2007/0079616 A1 | 4/2007 | Deal |

FOREIGN PATENT DOCUMENTS

| | | | |
|---|---|---|---|
| EP | 0907211 A1 * | 4/1999 | |
| GB | 1025555 | 4/1966 | |
| GB | 2154939 | 9/1985 | |
| JP | 01165183 | 8/1989 | |
| JP | 06296046 A * | 10/1994 | |
| JP | 2000244027 A * | 9/2000 | |
| JP | 2004047635 | 2/2004 | |
| WO | WO 02/21607 | 3/2002 | |
| WO | WO 2005/109535 | 11/2005 | |

* cited by examiner

THERMOELECTRIC MODULES AND RELATED METHODS

FIELD

The present disclosure relates generally to thermoelectric modules and to methods for making thermoelectric modules.

BACKGROUND

This section provides background information related to the present disclosure which is not necessarily prior art.

A thermoelectric module (TEM) is a relatively small solid state device that can operate as a heat pump or as an electrical power generator. When a thermoelectric module is used as a heat pump, the thermoelectric module utilizes the Peltier effect to move heat and may then be referred to as a thermoelectric cooler (TEC). When a thermoelectric module is used to generate electricity, the thermoelectric module may be referred to as a thermoelectric generator (TEG). The TEG may be electrically connected to a power storage circuit, such as a battery charger, etc. for storing electricity generated by the TEG.

With regard to use of a thermoelectric module as a TEC, and by way of general background, the Peltier effect refers to the transport of heat that occurs when electrical current passes through a thermoelectric material. Heat is either picked up where electrons enter the material and is deposited where electrons exit the material (as is the case in an N-type thermoelectric material), or heat is deposited where electrons enter the material and is picked up where electrons exit the material (as is the case in a P-type thermoelectric material). As an example, bismuth telluride may be used as a semiconductor material. A TEC is usually constructed by connecting alternating N-type and P-type elements of thermoelectric material ("elements") electrically in series and mechanically fixing them between two circuit boards. The use of an alternating arrangement of N-type and P-type elements causes electricity to flow in one spatial direction in all N-type elements and in the opposite spatial direction in all P-type elements. As a result, when connected to a direct current power source, electrical current causes heat to move from one side of the TEC to the other (e.g., from one circuit board to the other circuit board, etc.). Naturally, this warms one side of the TEC and cools the other side. A typical application exposes the cooler side of the TEC to an object, substance, or environment to be cooled.

In making a thermoelectric module (e.g., a TEC, TEG, etc.), cubic, near-cubic, and sub cubic shaped N-type and P-type elements may be used. For proper operation, each of the N-type and P-type elements must be consistently oriented in one of two different orientations (of a possible six total different orientations). Thus, several wrong orientations for each of the N-type and P-type elements are possible. Orienting the N-type and P-type elements (especially the cubic and near-cubic elements) using traditional processes (e.g., grid or matrix orientation processes, etc.) can be difficult at achieving such proper orientations consistently, thus often requiring manual placement or reworking of the N-type and P-type elements.

SUMMARY

This section provides a general summary of the disclosure, and is not a comprehensive disclosure of its full scope or all of its features.

Example embodiments of the present disclosure generally relate to methods for making thermoelectric modules. In one example embodiment, an example method generally includes coupling a first wafer and a second wafer together using a bonding agent, processing the first and second wafers to produce a first thermoelectric element and a second thermoelectric element where the first thermoelectric element and the second thermoelectric element are coupled together by the bonding agent, coupling the first thermoelectric element to a first conductor, coupling the second thermoelectric element to a second conductor, separating the first thermoelectric element and the second thermoelectric element, coupling the first thermoelectric element to a third conductor whereby the first thermoelectric element, the first conductor, and the third conductor form at least part of a thermoelectric module, and coupling the second thermoelectric element to a fourth conductor whereby the second thermoelectric element, the second conductor, and the fourth conductor form at least part of another thermoelectric module.

In another example embodiment, an example method generally includes coupling a first semiconductor material to a second semiconductor material such that the first semiconductor material is generally layered over the second semiconductor material, processing the first and second semiconductor materials to produce multiple pairs of coupled thermoelectric elements where each pair of coupled thermoelectric elements includes a first thermoelectric element formed from the first semiconductor material and a second thermoelectric element formed from the second semiconductor material, coupling the first thermoelectric element of at least two pairs of coupled thermoelectric elements to a first conductor, coupling the second thermoelectric element of at least two pairs of coupled thermoelectric elements to a second conductor, separating the first and second thermoelectric elements of each of said at least two pairs of coupled thermoelectric elements, coupling each of the separated at least two first thermoelectric elements to a third conductor whereby the at least two first thermoelectric elements, the first conductor, and the third conductor form at least part of a thermoelectric module, and coupling each of the separated at least two second thermoelectric elements to a fourth conductor whereby the at least two second thermoelectric elements, the second conductor, and the fourth conductor form at least part of another thermoelectric module.

Example embodiments of the present disclosure are also generally directed toward stacked thermoelectric structures for use in forming thermoelectric modules. In one example embodiment, an example stacked thermoelectric structure generally includes a first thermoelectric element, a second thermoelectric element formed from the same type of material as the first thermoelectric element, and a bonding agent coupling the first thermoelectric element and the second thermoelectric element together thereby forming a thermoelectric element pair.

Example embodiments of the present disclosure are also generally directed toward thermoelectric modules constructed using stacked thermoelectric structures.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 5:
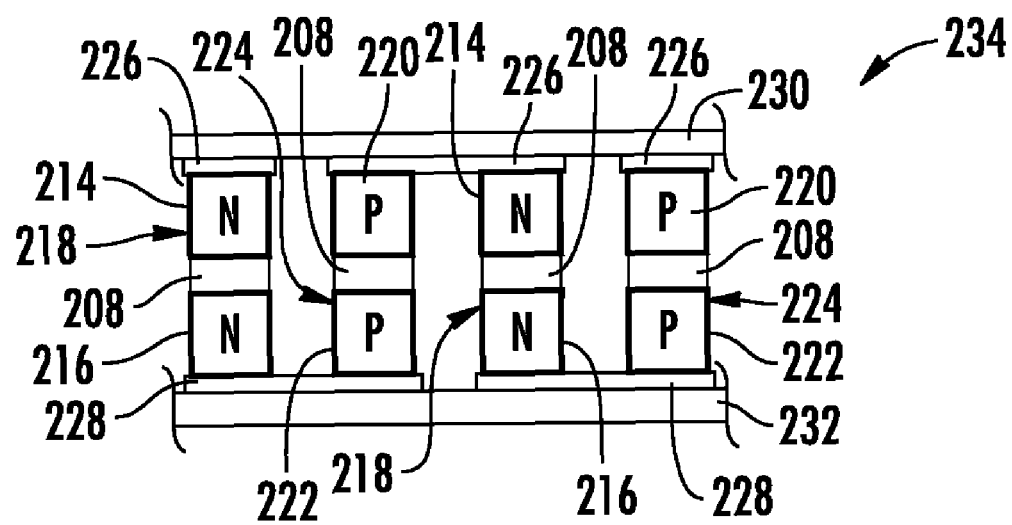
FIG. 5 is a fragmentary elevation view of a stacked thermoelectric structure formed using multiple stacked pairs of N-type elements formed from the coupled wafers of FIG. 2 and using multiple stacked pairs of P-type elements of thermoelectric material.
Figure 6:
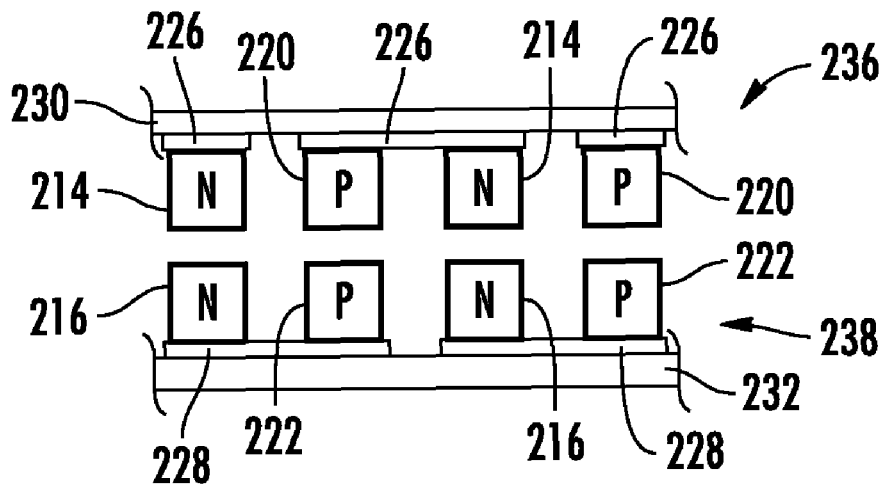
Figure 7:
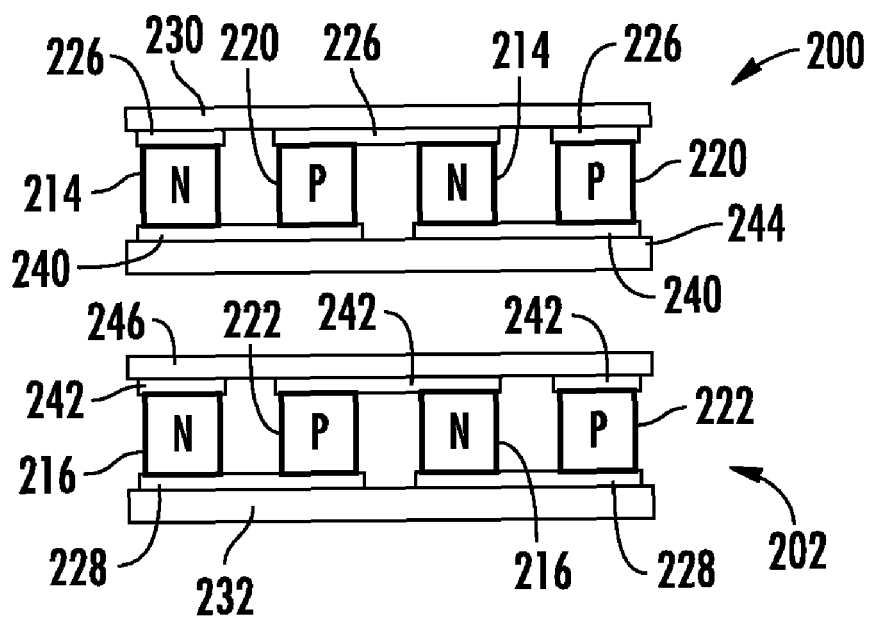

FIG. 6 is a fragmentary elevation view similar to that of FIG. 5 with the elements of each stacked pair of N-type elements shown separated and with the elements of each stacked pair of P-type elements shown separated to form two half thermoelectric structures; and FIG. 7 is a fragmentary elevation view illustrating two thermoelectric modules formed from the half thermoelectric structures of FIG. 6.

Corresponding reference numerals indicate corresponding parts throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 1:
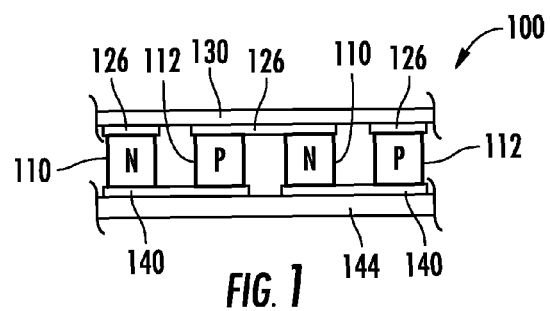
FIG. 1 is a fragmentary elevation view of an example thermoelectric module including one or more aspects of the present disclosure.

With reference now to the drawings, FIG. 1 illustrates a fragmentary view of an example thermoelectric module 100 including one or more aspects of the present disclosure. The illustrated thermoelectric module 100 generally includes an upper substrate 130 and a lower substrate 144 oriented generally parallel to the upper substrate 130. The upper substrate 130 and the lower substrate 144 may each be formed from suitable materials such as, for example, metalized ceramic materials, polymer materials, electrically insulating materials, etc. within the scope of the present disclosure.

Alternating N-type and P-type elements 110 and 112 (e.g., N-type and P-type thermoelectric elements, N-type and P-type semiconductor elements, N-type and P-type dice, etc.) are disposed generally between the upper and lower substrates 130 and 144 of the thermoelectric module 100. Upper and lower conductors 126 and 140 electrically connect adjacent N-type and P-type elements 110 and 112 together in series for operation. In this construction, the N-type and P-type elements 110 and 112 may be understood to be coupled to the substrates 130 and 144 via the conductors 126 and 140. Other configurations of N-type and P-type elements 110 and 112 (e.g., other than alternating configurations, other than series configurations, etc.) may be used within the scope of the present disclosure. In the illustrated embodiment, only two N-type elements 110 and only two P-type elements 112 are shown between the upper and lower substrates 130 and 144. But it should be appreciated that the thermoelectric module 100 may include multiple N-type elements 110 and multiple P-type elements 112 between the upper and lower substrates 130 and 144. In addition, the thermoelectric module 100 may include multiple rows and multiple columns of the N-type and P-type elements 110 and 112 (in position between the substrates 130 and 144) within the scope of the present disclosure.

The illustrated N-type and P-type elements 110 and 112 are each generally cubic in shape (broadly, cuboid in shape). Each of the N-type and P-type elements 110 and 112 includes a width dimension and a height dimension visible in FIG. 1, and a depth dimension not visible in FIG. 1, but extending generally into the drawing of FIG. 1. Each of the N-type and P-type elements 110 and 112 may be formed from suitable semiconductor materials (e.g., bismuth telluride, etc.) within the scope of the present disclosure. The conductors 126 and 140 may include conductors suitable for electrically connecting the N-type and P-type elements 110 and 112 and the substrates 130 and 144; and the conductors 126 and 140 may be coupled to the N-type and P-type elements 110 and 112 and the substrates 130 and 144 by suitable means such as, for example, solder, welds, mechanical fasteners, etc. In other example embodiments, N-type and P-type elements may have shapes other than cubic, for example near cubic shapes, sub-cubic shapes, other cuboid shapes, etc. within the scope of the present disclosure. Further, N-type and P-type elements may have shapes other than cuboid shapes within the scope of the present disclosure.

In an example operation of the illustrated thermoelectric module 100, the thermoelectric module 100 may be electrically connected to one or more direct current (DC) power sources (e.g., three, six, twelve volt power sources, other power sources, etc.) (not shown) and operated as a thermoelectric cooler. Electrical current passing through the thermoelectric module 100 causes heat to be pumped from one side (e.g., the lower substrate 144, etc.) of the thermoelectric module 100 to the other side (e.g., the upper substrate 130, etc.) of the thermoelectric module 100. Naturally, this creates a warmer side (e.g., the upper substrate 130, etc.) and a cooler side (e.g., the lower substrate 144, etc.) for the thermoelectric module 100 such that objects exposed to the cooler side may subsequently be cooled. While example operation of the illustrated thermoelectric module 100 has been described in connection with a thermoelectric cooler, it should be understood that the illustrated thermoelectric module 100 could also be operated as a thermoelectric generator within the scope of the present disclosure.

An example method for making thermoelectric modules will now be described with reference to FIGS. 2 through 7. As illustrated, the example method can be used for making two thermoelectric modules 200 and 202 (FIG. 7) together. The example method may also allow for making the two thermoelectric modules 200 and 202 substantially simultaneously. In other example embodiments, however, example methods may provide for making thermoelectric modules together but not substantially simultaneously (e.g., components of two or more thermoelectric modules may be made together, but assembled at different times to make respective ones of the thermoelectric modules, etc.). In addition, other example methods may provide for making more than two thermoelectric modules together, with some of the example methods further providing for making at least some of the thermoelectric modules substantially simultaneously.

Figure 2:
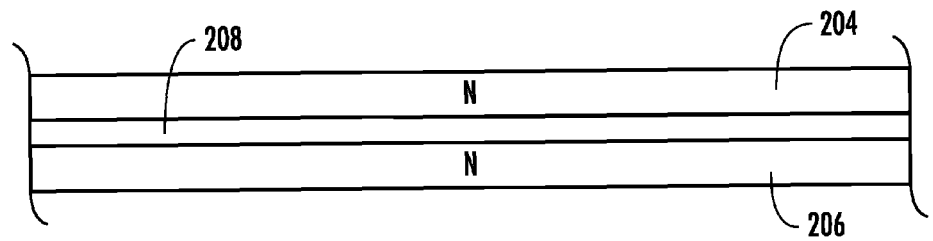
FIG. 2 is a fragmentary elevation view of two wafers of N-type thermoelectric material shown coupled together by a bonding agent.

As shown in FIG. 2, the example method generally includes coupling (e.g., bonding, etc.) a first wafer 204 and a second wafer 206 together using a bonding agent 208 (e.g., an adhesive such as cyanoacrylate adhesive, etc.; solder; a weld; a tape (e.g., a removable, meltable, etc. ultraviolet curable tape, etc.); magnets; other mechanical fasteners; etc.). The first wafer 204 is located generally above the second wafer 206 (as viewed in FIG. 2), with the first and second wafers 204 and 206 oriented in a generally parallel, layered, and/or stacked configuration (e.g., a double stack wafer configuration, etc.). Each of the first and second wafers 204 and 206 includes a width dimension and a height dimension visible in FIG. 2, and a depth dimension not visible in FIG. 2 but extending generally into the drawing of FIG. 2. The first wafer 204 and/or the second wafer 206 may be formed from semiconductor material such as, for example, bismuth telluride, etc. composed to create either a deficiency (N-type) or an excess (P-type) of electrons. In the illustrated embodiment, the first and second wafers 204 and 206 are both formed from an N-type semiconductor material. It should be appreciated that the first wafer 204 and/or the second wafer 206 may also have any desired thickness within the scope of the present disclosure.

Figure 3:
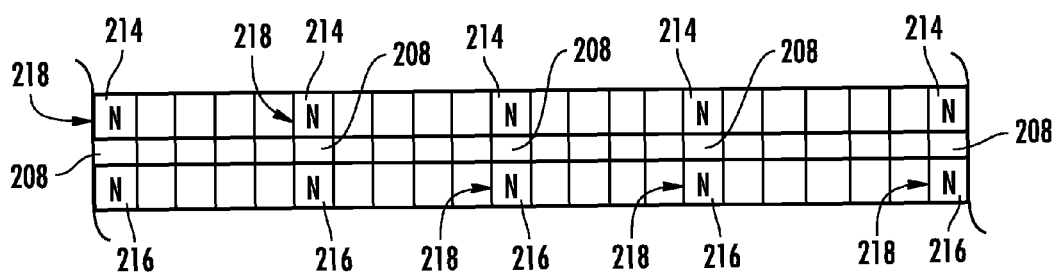
FIG. 3 is a fragmentary elevation view of the coupled wafers of FIG. 2 shown cut to produce multiple pairs of stacked N-type elements of thermoelectric material.
Figure 4:
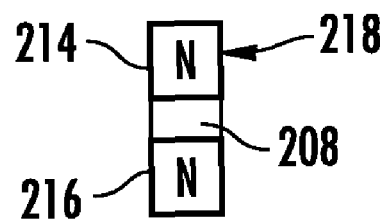
FIG. 4 is an elevation view of a stacked pair of N-type elements formed from the coupled wafers of FIG. 2.

As shown in FIGS. 3 and 4, the example method also generally includes processing the first and second wafers 204 and 206 to produce multiple first and second N-type elements 214 and 216 of thermoelectric material (e.g., multiple first and second dice, etc.). The first N-type elements 214 are formed from the first wafer 204, and the second N-type elements 216 are formed from the second wafer 206. As such, the first N-type elements 214 are the same type of material as the first wafer 204, and the second N-type elements 216 are the same type of material as the second wafer 206. Each of the first and second N-type elements 214 and 216 includes a width dimension and a height dimension visible in FIGS. 3 and 4, and a depth dimension not visible in FIGS. 3 and 4, but extending generally into the drawings of FIGS. 3 and 4.

Processing the first and second wafers 204 and 206 may include, for example, cutting, dicing, etc. the first and second wafers 204 and 206 at desired locations along the wafers 204 and 206 to produce the multiple first and second N-type elements 214 and 216. In the illustrated embodiment, twenty-two pairs 218 of the first and second N-type elements 214 and 216 are shown formed by processing the first and second wafers 204 and 206. However, more than or less than twenty-two pairs 218 of first and second N-type elements 214 and 216 may be formed within the scope of the present disclosure.

Cuts may be located along the first and second wafers 204 and 206 (e.g., along width dimensions of the first and second wafers 204 and 206 and/or along depth dimensions of the first and second wafers 204 and 206, etc.) so that each of the first and second N-type elements 214 and 216 have a desired width and/or depth dimension (and a height dimension generally corresponding to the height dimension of the respective wafer 204 and 206 from which they are formed). It should be appreciated that cutting, dicing, etc. the first and second wafers 204 and 206 may include, for example, mechanically cutting, dicing, etc. the wafers 204 and 206 (e.g., cutting, dicing, etc. the wafers 204 and 206 with a saw, a laser, electrical discharge technology, a water jet, etc.), chemically cutting, dicing, etc. the wafers 204 and 206, etc. within the scope of the present disclosure.

The N-type elements may have any desired shape and/or dimensions within the scope of the present disclosure. For example, in one example embodiment, N-type elements may have width dimensions, depth dimensions, and height dimensions that are substantially the same such that the N-type elements are generally cubic in shape (broadly, cuboid in shape). In other example embodiments, however, N-type elements may have at least one dimension (e.g., a width dimension, a depth dimension, a height dimension, etc.) different from another dimension thereof (e.g., a width dimension, a depth dimension, a height dimension, etc.) such that the N-type elements are not cubic in shape but are near cubic in shape, sub-cubic in shape, etc. (and, still broadly, cuboid in shape). In still other example embodiments, N-type elements may have shapes other than cuboid.

The processing operation performed on the first and second wafers 204 and 206 forms the multiple pairs 218 of the first and second N-type elements 214 and 216 such that, for each pair 218, a first N-type element 214 is coupled to a second N-type element 216 by the bonding agent 208 (e.g., in a generally stacked configuration, etc.). Each N-type element pair 218 has a height dimension of two N-type elements 214 and 216 (plus a thickness of the bonding agent 208). Thus, as shown in FIG. 4, the height dimension of the N-type element pair 218 is greater than a width dimension and a depth dimension of the N-type element pair 218. As such, each illustrated N-type element pair 218 has an aspect ratio (a ratio of the height dimension to the width dimension as viewed in FIG. 4) that is generally greater than one. As will be described in more detail hereinafter, this shape (e.g., this aspect ratio, etc.) of each of the N-type element pairs 218 may help with properly orienting the N-type elements 214 and 216.

The example method may also include coupling wafers of P-type thermoelectric material together, for example, a third wafer and a fourth wafer, using a bonding agent (e.g., an adhesive such as cyanoacrylate adhesive, etc.; solder; a weld; a tape (e.g., a removable, meltable, etc. ultraviolet curable tape, etc.); magnets; etc.) (not shown) in similar fashion to coupling the first and second wafers 204 and 206 together. Here, the third and fourth wafers may be processed to produce multiple first and second P-type elements of thermoelectric material (e.g., P-type elements 220 and 222 as shown in FIG. 5, etc.). The first P-type elements are formed from the third wafer, and the second P-type elements are formed from the fourth wafer. As such, the first P-type elements are the same type of material as the third wafer, and the second P-type elements are the same type of material as the fourth wafer.

Processing the third and fourth wafers may include similar operations to those described for processing the first and second wafers 204 and 206. For example, multiple pairs of P-type elements are formed from the third and fourth wafers, with each of the first P-type elements being coupled to one of the second P-type elements by the bonding agent (e.g., in a generally stacked configuration as shown in FIG. 5, etc.). As shown in FIG. 5, each P-type element pair 224 includes a first P-type element 220 and a second P-type element 222. Each of the first and second P-type elements 220 and 222 includes a width dimension and a height dimension visible in FIG. 5, and a depth dimension not visible in FIG. 5 but extending generally into the drawing of FIG. 5. And, each P-type element pair 224 has a height dimension of two P-type elements 220 and 222 (plus a thickness of a bonding agent 208). Thus, as shown in FIG. 5, and as with each of the N-type element pairs 218 illustrated in FIGS. 3 and 4, the height dimension of each of the P-type element pairs 224 formed from the third and fourth wafers is greater than a width dimension and a depth dimension of the P-type element pairs 224. As such, each illustrated P-type element pair 224 has an aspect ratio (a ratio of the height dimension to the width dimension as viewed in FIG. 5) that is generally greater than one. As will be described in more detail hereinafter, this shape (e.g., this aspect ratio, etc.) of each of the P-type element pairs 224 may help with properly orienting the P-type elements 220 and 222.

With continued reference to FIG. 5, the example method also generally includes orienting the N-type element pairs 218 and the P-type element pairs 224. In the illustrated embodiment, this includes positioning the N-type element pairs 218 in an alternating configuration with the P-type element pairs 224, with longitudinal axes of the N-type and P-type element pairs 218 and 224 generally parallel. As such, each N-type element pair 218 is located adjacent a P-type element pair 224. As previously stated, the shapes (e.g., the aspect ratios, etc.) of each of the N-type element and P-type element pairs 218 and 224 can provide a basis for properly orienting the pairs 218 and 224, and thus a basis for orienting each of the N-type elements 214 and 216 and P-type elements 220 and 222 thereof. For example, the aspect ratios of each of the illustrated N-type and P-type element pairs 218 and 224 are generally greater than one. This provides the N-type and P-type element pairs 218 and 224 with shapes that can allow for consistently orienting the longitudinal axes of the pairs 218 and 224 as desired (e.g., parallel to each other, etc.) using, for example, manual placement operations, gravity placement operations, etc. And, more particularly, this provides the N-type and P-type element pairs 218 and 224 with shapes that can allow for consistently orienting the longitudinal axes of the pairs 218 and 224 using automated placement operations (e.g., automated, robotic, etc. orientation processes such as surface mount processes, machine vision processes, vibratory orientation processes, etc.).

The example method further includes coupling the first N-type and P-type elements 214 and 220 of each of the N-type and P-type element pairs 218 and 224 to first conductors 226 and coupling the second N-type and P-type elements 216 and 222 of each of the N-type and P-type element pairs 218 and 224 to second conductors 228, and coupling the first conductors 226 to a first substrate 230 and coupling the second conductors 228 to a second substrate 232 (generally forming a stacked thermoelectric structure 234 (or a double-dice thermoelectric module, etc.)). As shown in FIG. 5, the N-type and P-type element pairs 218 and 224 are located generally between the first and second conductors 226 and 228 (and generally between the first and second substrates 230 and 232). The first conductors 226 thereby electrically connect adjacent first N-type and P-type elements 214 and 220 together; and the second conductors 228 thereby electrically connect adjacent second N-type and P-type elements 216 and 222 together.

The first and/or second N-type and P-type elements 214 and/or 216 and 220 and/or 222 may be coupled to the respective first and/or second conductors 226 and/or 228 by suitable means, for example, soldering, welding, mechanical fasteners, etc. within the scope of the present disclosure. In addition, the first and/or second conductors 226 and/or 228 may be coupled to the respective first and/or second substrates 230 and/or 232 by suitable means, for example, soldering, welding, mechanical fasteners, etc. within the scope of the present disclosure. Further, the first and/or second substrates 230 and/or 232 may be formed from suitable materials such as, for example, metalized ceramic materials, polymer materials, electrically insulating materials, etc. within the scope of the present disclosure.

Referring now to FIG. 6, the example method also generally includes separating the first N-type element from the second N-type element of each N-type element pair, and separating the first P-type element from the second P-type element of each P-type element pair. This separates the first substrate 230, the first conductors 226, and the first N-type and P-type elements 214 and 220 from the second substrate 232, the second conductors 228, and the second N-type and P-type elements 216 and 222, thereby forming two half thermoelectric structures 236 and 238 (or two half modules, etc.). Separating the first N-type and P-type elements 214 and 220 from the respective second N-type and P-type elements 216 and 222 may include, for example, one or more of removing the bonding agent 208 from between the respective first and second N-type and P-type elements 214, 216, 220, and 222, dissolving the bonding agent 208, melting the bonding agent 208, manipulating the bonding agent 208 to loosen its bond on the respective elements 214, 216, 220, and 222, etc. within the scope of the present disclosure.

As one example, separating the first N-type and P-type elements 214 and 220 from the respective second N-type and P-type elements 216 and 222 may include dissolving an adhesive bonding agent by suitable processes and/or operations such as, for example, immersing at least part of the stacked thermoelectric structure 234 in a solvent, introducing at least part of the stacked thermoelectric structure 234 into a solvent vapor chamber, etc. In this example, any suitable solvent may be used to dissolve the adhesive bonding agent such as, for example, acetone, nitomethane, gamma-butyroctane, etc. within the scope of the present disclosure. As another example, separating the first N-type and P-type elements 214 and 220 from the respective second N-type and P-type elements 216 and 222 may include melting a solder bonding agent by suitable processes and/or operations such as, for example, heating the solder bonding agent, etc. As another example, separating the first N-type and P-type elements 214 and 220 from the respective second N-type and P-type elements 216 and 222 may include curing (broadly, removing) an ultraviolet curable tape. It should be appreciated that separating the first N-type and P-type elements 214 and 220 from the respective second N-type and P-type elements 216 and 222 may or may not include active heating operations (e.g., may or may not include actively heating the bonding agent 208, etc.) within the scope of the present disclosure.

As shown in FIG. 7, the example method further generally includes coupling the first N-type and P-type elements 214 and 220 of the respective N-type and P-type element pairs 218 and 224 to third conductors 240 and coupling the second N-type and P-type elements 216 and 222 of the respective N-type and P-type element pairs 218 and 224 to fourth conductors 242, and coupling the third conductors 240 to a third substrate 244 and coupling the fourth conductors 242 to a fourth substrate 246. The first N-type and P-type elements 214 and 220 are located generally between the first and third conductors 226 and 240 (and generally between the first and third substrates 230 and 244), while the second N-type and P-type elements 216 and 222 are located generally between the second and fourth conductors 228 and 242 (and generally between the second and fourth substrates 232 and 246). The first N-type and P-type elements 214 and 220, the first conductors 226, the first substrate 230, the third conductors 240, and the third substrate 244 form at least part of a first thermoelectric module 200. And, the second N-type and P-type elements 216 and 222, the second conductors 228, the second substrate 232, the fourth conductors 242, and the fourth substrate 246 form at least part of a second thermoelectric module 202.

In other example embodiments, first and second wafers (or third and fourth wafers, etc.) may be coupled together with one or more layers of additional material included between the wafers. The one or more additional layers of material increases a height dimension of the coupled wafers. More particularly, the one or more additional layers of material increases a height dimension of element pairs formed by processing (e.g., cutting, etc.) the coupled wafers. This in turn increases aspect ratios of the element pairs, and can help support the element pairs during orientation operations, and can help with properly orienting the element pairs during construction of thermoelectric modules. The one or more layers of additional material may include any suitable material within the scope of the present disclosure including, for example, but not limited to, thermoelectric materials, alloys, etc.

In still other example embodiments, N-type and P-type elements can be arranged, oriented, etc. differently than illustrated herein (e.g., in other than alternating configurations, in other than series configurations, etc.) and still provide suitable configurations for pumping heat from one side of the elements to another side of the elements (e.g., from one substrate to another substrate, etc.).

Example methods disclosed herein may allow for making at least two or more thermoelectric modules substantially simultaneously, and may provide for improved throughput, yield, and or efficiency of production. Example methods may also allow for production of cubic and/or near cubic thermoelectric elements with reduced concerns that the thermoelectric elements may orient incorrectly during production. For example, thermoelectric element can be formed that are taller than they are wide, which may be a preferred condition and which may allow for improved orientation, mechanical and/or optical verification and/or position control, etc. of the thermoelectric element pairs.

It should be appreciated that any numerical values are provided in the present disclosure for illustrative purposes only. The particular values provided are not intended to limit the scope of the present disclosure.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A method for making thermoelectric modules, the method comprising:
   coupling a first wafer and a second wafer together using a bonding agent, the first and second wafers being formed from the same N-type or P-type material;
   processing the first and second wafers to produce a first thermoelectric element from the first wafer and a second thermoelectric element from the second wafer, the first thermoelectric element and the second thermoelectric element being coupled together by the bonding agent such that the first and second thermoelectric elements are formed from the same N-type or P-type material and thereby define at least one pair of coupled N-type or P-type thermoelectric elements;
   coupling the first thermoelectric element to a first conductor;
   coupling the second thermoelectric element to a second conductor;
   separating the first thermoelectric element and the second thermoelectric element while maintaining the coupling between the first thermoelectric element and the first conductor and while maintaining the coupling between the second thermoelectric element and the second conductor;
   coupling the first thermoelectric element to a third conductor whereby the first thermoelectric element, the first conductor, and the third conductor form at least part of a thermoelectric module; and
   coupling the second thermoelectric element to a fourth conductor whereby the second thermoelectric element, the second conductor, and the fourth conductor form at least part of another thermoelectric module.

2. The method of claim 1, further comprising orienting the first and second wafers in a generally parallel and stacked configuration, and wherein processing the first and second wafers includes processing the stacked first and second wafers into multiple stacked pairs of N-type or P-type thermoelectric elements formed from the same N-type or P-type material.

3. The method of claim 1, wherein processing the first and second wafers includes cutting the first and second wafers to produce the first thermoelectric element and the second thermoelectric element.

4. The method of claim 1, wherein processing the first and second wafers includes processing the first and second wafers to produce multiple first thermoelectric elements from the first wafer and multiple second thermoelectric elements from the second wafer, each first thermoelectric element being coupled to a second thermoelectric element by the bonding agent such that the multiple first and second thermoelectric elements thereby define multiple pairs of coupled N-type or P-type thermoelectric elements.

5. The method of claim 4, further comprising orienting at least two pairs of coupled thermoelectric elements so that longitudinal axes of the at least two pairs of coupled thermoelectric elements are generally parallel.

6. The method of claim 1, wherein:
the first and second wafers are both formed from an N-type material;
processing the first and second wafers includes processing the first and second wafers to produce at least one pair of coupled N-type thermoelectric elements;
the method further comprises:
coupling a third wafer and a fourth wafer together using a bonding agent, the third and fourth wafers both formed from a P-type material; and
processing the third and fourth wafers to produce at least one pair of coupled P-type thermoelectric elements.

7. The method of claim 1, wherein the first thermoelectric element and/or the second thermoelectric element is generally cuboid shaped.

8. The method of claim 1, wherein the bonding agent includes adhesive, and wherein separating the first thermoelectric element and the second thermoelectric element includes dissolving the adhesive with a solvent.

9. The method of claim 1, wherein the bonding agent includes tape, and wherein separating the first thermoelectric element and the second thermoelectric element includes removing the tape.

10. The method of claim 1, wherein the first thermoelectric element is coupled to the first conductor by a solder connection, and the second thermoelectric element is coupled to the second conductor by a solder connection, and wherein the bonding agent is different from the solder connections such that the first thermoelectric element and the second thermoelectric element can be separated while maintaining the solder connection between the first thermoelectric element and the first conductor and while maintaining the solder connection between the second thermoelectric element and the second conductor.

11. The method of claim 1, wherein:
the first conductor is coupled to a first substrate;
the second conductor is coupled to a second substrate;
the third conductor is coupled to a third substrate;
the fourth conductor is coupled to a fourth substrate;
the first thermoelectric element is between the first and third conductors and between the first and third substrates; and
the second thermoelectric element is between the second and fourth conductors and between the second and fourth substrates.

12. A method for making thermoelectric modules, the method comprising:
coupling a first wafer and a second wafer together using a bonding agent, the first and second wafers both formed from an N-type material;
processing the first and second wafers to produce one or more first N-type thermoelectric elements and one or more second N-type thermoelectric elements, each first N-type thermoelectric element being coupled to a second N-type thermoelectric element by the bonding agent such that the first and second N-type thermoelectric elements thereby define one or more pairs of coupled N-type thermoelectric elements;
coupling a third wafer and a fourth wafer together using a bonding agent, the third and fourth wafers both formed from a P-type material;
processing the third and fourth wafers to produce one or more first P-type thermoelectric elements and one or more second P-type thermoelectric elements, each first P-type thermoelectric element being coupled to a second P-type thermoelectric element by the bonding agent such that the first and second P-type thermoelectric elements thereby define one or more pairs of coupled P-type thermoelectric elements;
coupling the first N-type and P-type thermoelectric elements to one or more first conductors;
coupling the second N-type and P-type thermoelectric elements to one or more second conductors;
separating the first and second N-type thermoelectric elements and the first and second P-type elements while maintaining the coupling to the first and second conductors;
coupling the first N-type and P-type thermoelectric elements to one or more third conductors such that the first N-type and P-type thermoelectric elements are generally between the first and third conductors, whereby the first N-type and P-type thermoelectric elements and the first and third conductors form at least part of a first thermoelectric module; and
coupling the second N-type and P-type thermoelectric elements to one or more fourth conductors such that the second N-type and P-type thermoelectric elements are generally between the second and fourth conductors, whereby the second N-type and P-type thermoelectric elements and the second and fourth conductors form at least part of a second thermoelectric module.

13. The method of claim 12, further comprising orienting a pair of coupled thermoelectric elements formed from the N-type material adjacent a pair of coupled thermoelectric elements formed from the P-type material such that longitudinal axes of the adjacent pairs of coupled thermoelectric elements are generally parallel.

14. The method of claim 13, further comprising orienting multiple pairs of coupled thermoelectric elements formed from the N-type material and multiple pairs of coupled thermoelectric elements formed from the P-type material such that longitudinal axes of the multiple pairs of coupled thermoelectric elements are generally parallel.

15. The method of claim 12, wherein:
the one or more first conductors are coupled to a first substrate and electrically connect adjacent first N-type and P-type thermoelectric elements;

the one or more second conductors are coupled to a second substrate and electrically connect adjacent second N-type and P-type thermoelectric elements;

the one or more third conductors are coupled to a third substrate;

the one or more fourth conductors are coupled to a fourth substrate;

the first N-type and P-type thermoelectric elements are between the first and third conductors and between the first and third substrates; and the second N-type and P-type thermoelectric elements are between the second and fourth conductors and between the second and fourth substrates.

16. A method for making thermoelectric modules, the method comprising:

coupling a first semiconductor material to a second semiconductor material such that the first semiconductor material is generally layered over the second semiconductor material, the first and second semiconductor materials being formed from the same N-type or P-type material;

processing the first and second semiconductor materials to produce one or more pairs of coupled N-type or P-type thermoelectric elements, each pair of coupled thermoelectric elements including a first thermoelectric element formed from the first semiconductor material and a second thermoelectric element formed from the second semiconductor material such that the first and second thermoelectric elements of the one or more pairs of coupled thermoelectric elements are formed from the same N-type or P-type material;

coupling the first thermoelectric element of the one or more pairs of coupled N-type or P-type thermoelectric elements to one or more first conductors;

coupling the second thermoelectric element of the one or more pairs of coupled N-type or P-type thermoelectric elements to one or more second conductors;

separating the first and second thermoelectric elements of each of said one or more pairs of coupled N-type or P-type thermoelectric elements while maintaining the coupling to the first and second conductors.

17. The method of claim 16, wherein:

coupling the first semiconductor material to the second semiconductor material includes coupling the first semiconductor material to the second semiconductor material using adhesive and/or tape; and separating the first and second thermoelectric elements includes dissolving the adhesive using a solvent and/or removing the tape.

18. The method of claim 17, wherein processing the first and second semiconductor materials includes cutting the first and second semiconductor materials to produce the one or more pairs of coupled N-type or P-type thermoelectric elements.

19. The method of claim 16, further comprising orienting multiple pairs of coupled thermoelectric elements so that longitudinal axes of each of the multiple pairs of coupled thermoelectric element are generally parallel.

20. The method of claim 16, wherein at least one first thermoelectric element of the one or more pairs of coupled N-type or P-type thermoelectric elements includes a generally cubic shape, and wherein at least one second thermoelectric element of the one or more pairs of coupled N-type or P-type thermoelectric elements includes a generally cuboid shape.

21. The method of claim 16, wherein:

the first conductor is coupled to a first substrate;

the second conductors is coupled to a second substrate;

the third conductor is coupled to a third substrate;

the fourth conductor is coupled to a fourth substrate;

the first thermoelectric element is between the first and third conductors and between the first and third substrates; and the second thermoelectric element is between the second and fourth conductors and between the second and fourth substrates.

22. The method of claim 16, wherein:

coupling the first semiconductor material to the second semiconductor material includes coupling the first semiconductor material to the second semiconductor material using a bonding agent;

the first thermoelectric element of the one or more pairs of coupled N-type or P-type thermoelectric elements is coupled to the one or more first conductors by a solder connection;

the second thermoelectric element of the one or more pairs of coupled N-type or P-type thermoelectric elements is coupled to the one or more second conductors by a solder connection; and the bonding agent is different from the solder connections such that the first thermoelectric element and the second thermoelectric element can be separated while maintaining the solder connection between the first thermoelectric element and the first conductor and while maintaining the solder connection between the second thermoelectric element and the second conductor.

23. The method of claim 16, further comprising:

coupling the separated first thermoelectric elements of the one or more pairs of coupled N-type or P-type thermoelectric elements to one or more third conductors; and coupling the separated second thermoelectric elements of the one or more pairs of coupled N-type or P-type thermoelectric elements to one or more second conductors.

24. A method for making thermoelectric modules, the method comprising:

coupling a first semiconductor material to a second semiconductor material, the first and second semiconductor materials being formed from an N-type material;

processing the first and second semiconductor materials to produce one or more pairs of coupled N-type thermoelectric elements, each pair of coupled N-type thermoelectric elements including a first N-type thermoelectric element formed from the first semiconductor material and a second N-type thermoelectric element formed from the second semiconductor material;

coupling a third semiconductor material to a fourth semiconductor material, the third and fourth semiconductor materials being formed from a P-type material;

processing the third and fourth semiconductor materials to produce one or more pairs of coupled P-type thermoelectric elements, each pair of coupled P-type thermoelectric elements including a first P-type thermoelectric element formed from the third semiconductor material and a second P-type thermoelectric element formed from the fourth semiconductor material;

coupling the first N-type and P-type thermoelectric elements to one or more first conductors;

coupling the second N-type and P-type thermoelectric elements to one or second conductors;

separating the first and second N-type thermoelectric elements and the first and second P-type elements while maintaining the coupling to the first and second conductors;

coupling the first N-type and P-type thermoelectric elements to one or more third conductors such that the first N-type and P-type thermoelectric elements are generally between the first and third conductors, whereby the first N-type and P-type thermoelectric elements and the first and third conductors form at least part of a first thermoelectric module; and coupling the second N-type and P-type thermoelectric elements to one or more fourth conductors such that the second N-type and P-type thermoelectric elements are generally between the second and fourth conductors, whereby the second N-type and P-type thermoelectric elements and the second and fourth conductors form at least part of a second thermoelectric module.

25. The method of claim 24, wherein:

the one or more first conductors are coupled to a first substrate and electrically connect adjacent first N-type and P-type thermoelectric elements;

the one or more second conductors are coupled to a second substrate and electrically connect adjacent second N-type and P-type thermoelectric elements;

the one or more third conductors are coupled to a third substrate;

the one or more fourth conductors are coupled to a fourth substrate;

the first N-type and P-type thermoelectric elements are between the first and third conductors and between the first and third substrates; and the second N-type and P-type thermoelectric elements are between the second and fourth conductors and between the second and fourth substrates.

26. A method for making thermoelectric modules, the method comprising:

coupling a first wafer and a second wafer together using a bonding agent, the first and second wafers both formed from an N-type material;

processing the first and second wafers to produce one or more first N-type thermoelectric elements and one or more second N-type thermoelectric elements, each first N-type thermoelectric element being coupled to a second N-type thermoelectric element by the bonding agent such that the first and second N-type thermoelectric elements thereby define one or more pairs of coupled N-type thermoelectric elements;

coupling a third wafer and a fourth wafer together using a bonding agent, the third and fourth wafers both formed from a P-type material;

processing the third and fourth wafers to produce one or more first P-type thermoelectric elements and one or more second P-type thermoelectric elements, each first P-type thermoelectric element being coupled to a second P-type thermoelectric element by the bonding agent such that the first and second P-type thermoelectric elements thereby define one or more pairs of coupled P-type thermoelectric elements;

coupling the first N-type and P-type thermoelectric elements to one or more first conductors;

coupling the second N-type and P-type thermoelectric elements to one or more second conductors;

separating the first and second N-type thermoelectric elements and the first and second P-type elements while maintaining the coupling to the first and second conductors;

coupling the separated first N-type and P-type thermoelectric elements to one or more third conductors, whereby the first N-type and P-type thermoelectric elements and the first and third conductors form at least part of a first thermoelectric module; and coupling the separated second N-type and P-type thermoelectric elements to one or more fourth conductors, whereby the second N-type and P-type thermoelectric elements and the second and fourth conductors form at least part of a second thermoelectric module.

27. The method of claim 26, wherein:

processing the first and second wafers includes cutting the first and second wafers to produce the first and second N-type thermoelectric elements; and processing the third and fourth wafers includes cutting the third and fourth wafers to produce the first and second P-type thermoelectric elements.

\* \* \* \* \*